United States Patent [19]

Pintchovski

[11] Patent Number: 4,619,038
[45] Date of Patent: Oct. 28, 1986

[54] SELECTIVE TITANIUM SILICIDE FORMATION

[75] Inventor: Faivel S. Pintchovski, Austin, Tex.

[73] Assignee: Motorola, Inc., Schaumburg, Ill.

[21] Appl. No.: 765,631

[22] Filed: Aug. 15, 1985

[51] Int. Cl.$^4$ .......................................... H01L 21/441
[52] U.S. Cl. ........................................ 29/590; 29/591; 148/DIG. 147; 427/93; 427/99; 427/126.1; 427/255.2
[58] Field of Search .................. 427/93, 95, 96, 255.2, 427/126.1; 148/DIG. 147; 29/589, 590, 591

[56] References Cited

U.S. PATENT DOCUMENTS

| | | | |
|---|---|---|---|
| 3,801,365 | 4/1974 | Hrzek | 427/95 |
| 4,359,490 | 11/1982 | Lehrer | 427/95 |
| 4,501,769 | 2/1985 | Hieber et al. | 427/95 |
| 4,504,521 | 3/1985 | Widmer et al. | 427/85 |
| 4,568,565 | 2/1986 | Gupta et al. | 427/53.1 |

OTHER PUBLICATIONS

S. P. Murarka, et al., "Refractory Silicides of Titanium and Tantalum for Low Resistivity Gates and Interconnects," IEEE Journal of Solid-State Circuits, vol. SC-15, No. 4, Aug., 1980, pp. 474-482.

M. E. Alperin, et al., "Development of the Self-Aligned Titanium Silicide Process for VLSI Applications," IEEE Journal of Solid-State Circuits, vol. SC-20, No. 1, Feb. 1985, pp. 61-69.

Murarka, "Refractory Silicides for IC," J. Vac. Sci. Technol., vol. 17, No. 4, Jul./Aug. 1980, pp. 775-792.

Kern et al., "Low Pressure Chemical Vapor Deposition for VLSI," IEEE Trans. Elec. Dev., vol. ED-26, No. 4, Apr. 1979, pp. 647-657.

Tedrow et al., "LPCVD of Titanium Silicide," Appl. Phys. Lett., 46(2), Jan. 15, 1985, pp. 189-191.

Iyer et al., "New Salicide Spacer Technology," IBM Technical Disclosure Bulletin, vol. 27, No. 3, Aug. 1984.

Primary Examiner—Brian E. Hearn
Assistant Examiner—Tuan Quach
Attorney, Agent, or Firm—Anthony J. Sarli, Jr.; Jeffrey Van Myers; David L. Mossman

[57] ABSTRACT

A process for selective formation of a titanium silicide, TiSi$_2$, layer at high temperatures and low pressures via chemical vapor deposition during semiconductor device manufacturing. At 700° to 1000° C. and 0.5 to 1.5 torr, TiSi$_2$ deposits only on exposed silicon or polysilicon surfaces and not at all on neighboring silicon dioxide. The process provides an excellent means of providing low resistivity interconnects without a mask step or subsequent annealing and removal of unreacted titanium.

13 Claims, 4 Drawing Figures

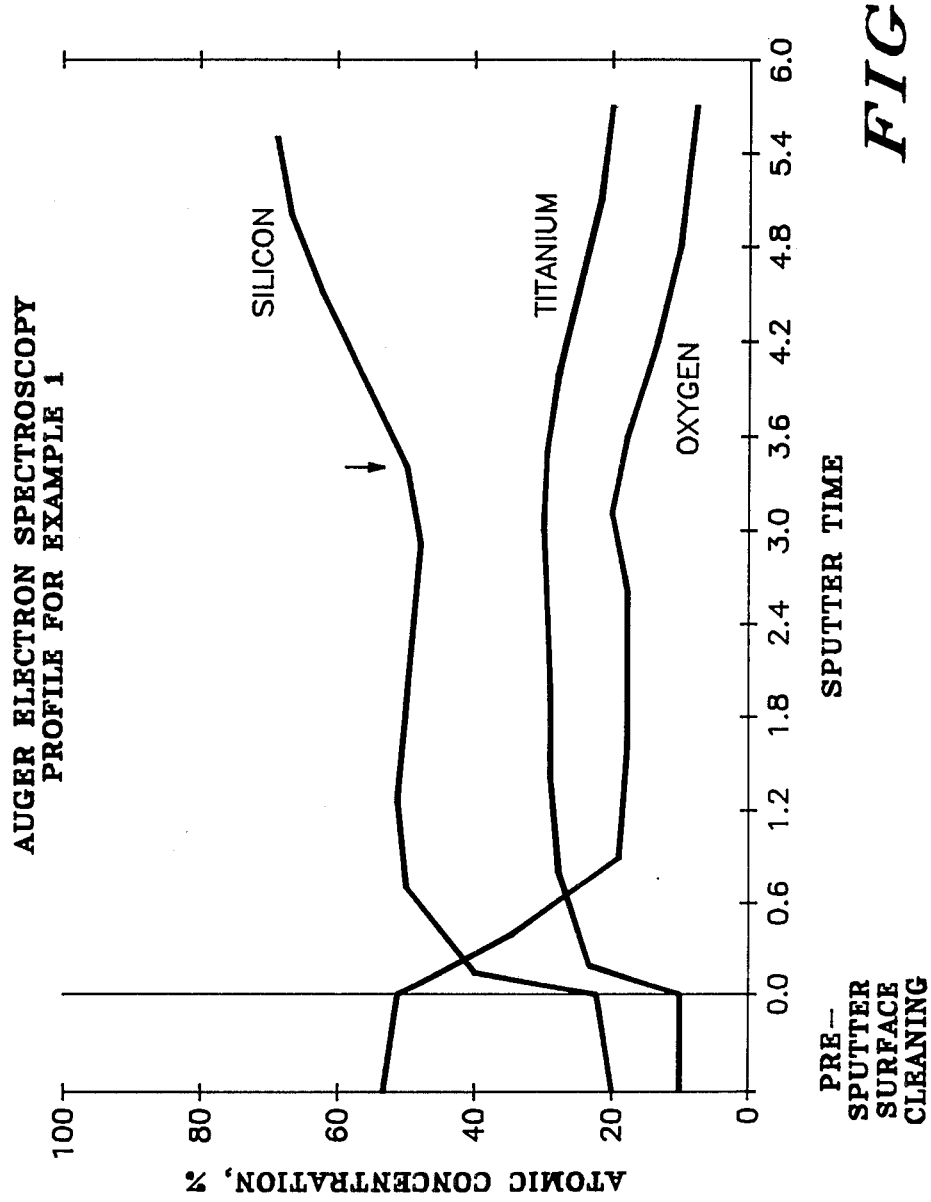

SELECTIVE TITANIUM SILICIDE FORMATION

FIELD OF THE INVENTION

The present invention relates generally to creating refractory metal silicide films during semiconductor manufacturing and, more particularly, relates to selectively forming titanium silicide on silicon in preference to silicon dioxide at high temperatures and low pressures.

BACKGROUND OF THE INVENTION

Polycrystalline silicon (polysilicon) has long been used for gates and interconnecting conductor lines for metal oxide semiconductor (MOS) integrated circuits. However, one disadvantage of polysilicon is its relatively high electrical resistance, on the order of 20 to 30 ohms per square for a typical film of about 5000 Angstroms thickness. This high electrical resistance introduces RC time delays, particularly when the polysilicon lines are long. While this problem is not particularly acute for large scale integrated (LSI) MOS circuits, as regards to very large scale integrated (VLSI) circuits, the relatively high resistivity of polycrystalline silicon substantially limits circuit performance.

One alternative is to replace the polysilicon with a refractory metal silicide such as molybdenum silicide, tungsten silicide, tantalum silicide, titanium silicide and mixtures thereof. The silicides have processing properties similar to polysilicon with the added advantage of an order-of-magnitude lower sheet resistance. However, some silicide-gate designs have stability problems. If a silicide material is placed directly over the gate oxide, high temperature processing can cause the metal to diffuse through the gate and degrade the device performance via gate oxide breakdown.

An optional modification of this alternative that potentially avoids the metal diffusion problem is the use of a gate sandwich structure consisting of polysilicon on the bottom and a metal silicide on the top with only the polysilicon contacting the gate oxide. This polysilicon-silicide structure is commonly called a polycide. This approach offers the advantage of lower sheet resistance on the order of 1 to 5 ohms per square and is attractive from a process standpoint since it is more easily inserted into an existing process line. Because of these advantageous features, this approach has been gaining widespread popularity.

A number of polycide structures have been reported in the prior art. These include silicides of almost all the transition metals, and chromium, nickel and iron formed on polysilicon. Of these, a tungsten polycide structure consisting of tungsten disilicide ($WSi_2$) on top of a doped polysilicon layer has been the subject of intensive investigation not only because of its low resistivity but also because of its stable chemical processing properties and compatibility as a gate material (i.e. MOS devices fabricated with $WSi_2$/polysilicon gate material exhibit excellent silicon dioxide-silicon inter-face properties such as low surface state density, $Q_{ss}$, and low surface state density distribution) while preserving the proven polysilicon gate advantages.

However, the use of silicides in VLSI technology causes a number of problems. Specifically, it is difficult to provide a good ohmic contact between a silicide interconnect layer and a silicon substrate. Silicides are dopant sinks and dopant loss from heavily doped areas through silicide films are a well-documented phenomenon, see M. Y. Tsai, et al. *J. Appl. Phys.*, Vol. 52, 1981, p. 5350. Secondly, silicides, especially when deposited by sputtering, do not always provide good step coverage over the vertical features of the integrated circuit. That is, sputtered silicides may be characterized by electrical discontinuities when they are deposited over vertical steps associated with integrated circuit devices. This is especially critical when the silicide is used by itself rather than in combination with a polycrystalline silicn. Finally, it is necessary to avoid any reaction between the silicide and the contacting layers or chemicals which will come in contact with the silicide during the manufacturing process.

Metal evaporation and sputtering are well known techniques for depositing metal films. A less common, but more efficient method is chemical vapor deposition (CVD) as described in P. A. Gargini, et al., "WOS: Low Resistance Self-aligned Source, Drain and Gate Transistors," *International Electron Devices Meeting Papers* December 1981, pp. 54–57. T. Moriya, et al., in "A Planar Metallization Process—Its Application to Tri-level Aluminum Interconnection," *International Electron Devices Meeting Papers* published December, 1983, pp. 550–553 teaches that contact windows or via holes of a high aspect ratio may be refilled with tungsten by selective CVD employing $WF_6$. However, tungsten films made in this fashion are subject to encroachment problems during the deposition process. And although the tungsten CVD process is noted as selective in that the tungsten only deposits on the silicon substrate rather than any silicon oxide present, selectivity is completely lost if the reaction temperature rises to about 400° C. or above.

Salicidation processes are also known to give titanium silicide ($TiSi_2$) films with advantageous properties as described in M. E. Alperin, et al., "Development of the Self-Aligned Titanium Silicide Process for VLSI Applications," *IEEE Journal of Solid-State Circuits*, Vol. SC-20, No. 1, February 1985, pp.61–69. The titanium silicide formation process is free from encroachment during processing. However, the particular method noted above requires a titanium and titanium nitride strip and an annealing step after the $TiSi_2$ film is formed.

U.S. Pat. No. 4,501,769 to Hieber, et al. notes that high melting point silicides, such as tantalum and molybdenum, may be selectively deposited on substrates containing at least some silicon regions by thermally decomposing gaseous silicon, such as $SiH_2Cl_2$, and halogen compounds containing the metal in a reaction gas to deposit the metal silicide from the gaseous phase onto a controllably heated substrate containing the silicon regions. The process produces a gaseous hydrogen halide. The method requires adjusting the substrate deposition temperature and composition of the reaction gas to values at which silicide nucleation in regions of the substrate other than silicon regions is suppressed during deposition from the gaseous phase due to the presence of the hydrogen halide.

SUMMARY OF THE INVENTION

Accordingly it is an object of the present invention to provide a process for forming source-drain and gate silicidation and contact filling using low resistivity refractory metals to facilitate high reliability interconnections in semiconductor integrated circuits.

Another object of the invention is to provide a titanium silicide formation process that is completely selective to deposition upon exposed silicon or polysilicon.

An additional object of the invention is to provide a process for titanium silicide formation that does not permit subsequent encroachment underneath the silicide layer.

Still another object of the present invention is to provide a method for titanium silicide formation which requires no anneal and subsequent etch of unreacted titanium from the surface of the wafer.

In carrying out these and other objects of the invention, there is provided, in one form, a process for selectively forming titanium silicide on polysilicon via low presssure chemical vapor deposition (LPCVD) comprising introducing a titanium halide gas and hydrogen into a reaction zone having a polysilicon surface present wherein the reaction temperature ranges from 700° to 100° C. and the reaction pressure ranges from 0.5 to 1.5 Torr.

BRIEF DESCRIPTION OF THE DRAWINGS

FIG. 4 is an Auger electron spectroscopy profile for Example 1 hereinafter described.

DETAILED DESCRIPTION OF THE INVENTION

Titanium silicide, $TiSi_2$, is a low resistivity refractory metal, with a typical resistivity value of 12 to 20 microhm-cm. It can be used as a gate electrode or as an interconnect in advanced MOS memories and microprocessors in place of or as a supplement to the more resistive polysilicon.

It has been discovered that $TiSi_2$ may be selectively formed on silicon without deposition on neighboring silicon oxide, $SiO_2$, where the selectivity is complete. Throughout this description, the term "silicon" is used to refer to both monocrystalline and polycrystalline silicon. Silicon dioxide is, of course, not included in the definition of "silicon".

The 100% selectivity of this process allows the avoidance of subsequent etching of $TiSi_2$. In addition, a selective film of $TiSi_2$ over n+ and/or p+ preohmic areas improves the ohmic contact between aluminum metal layers and n+ and/or p+ areas. For very small geometries, such as those being encountered in VLSI, this latter factor is very important for device performance.

In this process, $TiSi_2$ is selectively formed on silicon in a hot wall, less than atmospheric pressure chemical vapor deposition system, also known as LPCVD. In this system, from 50 to 75 wafers may be positioned vertically in an LPCVD reaction tube. In gaseous form, a titanium halide gas and hydrogen are introduced into the reaction tube and $TiSi_2$ is formed only on exposed silicon surfaces and not at all on silicon oxide surfaces. It is preferred that the titanium halide gas be a titanium tetrahalide gas. Titanium tetrachloride is particularly preferred. Nitrogen may also be present as an inert diluent.

Simplified, suggested reactions are proposed as follows, although the invention should not be limited thereby:

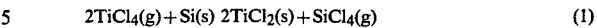  (1)

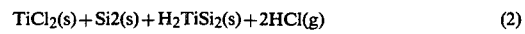  (2)

It has been observed that a minimum $H_2$ and/or $N_2$ gas: $TiCl_4$ dilution of 50:1 is necessary at the high reaction temperatures to avoid the etching of silicon. The temperature for this LPCVD reaction should range from 700° to 1000° C. A preferred reaction temperature range is from 750° to 850° C. However, it should also be noted that these reaction temperature ranges are higher than usual for LPCVD processes. Typically, LPCVD reactions in hot wall reactors are not conducted over 700° C. Special modifications to commercially available LPCVD equipment, which are the subject of copending patent application Ser. No. 765,640, filed of even date, were required to achieve these reaction conditions. Briefly, the modifications involve the inclusion of water cooled end caps on the LPCVD tube.

As suggested, the minimum $TiCl_4$ dilution of 50:1 may be accomplished with a mixture of $N_2$ and $H_2$ gases. The nitrogen is inert and simply acts as a diluent. However, it should be noted that the presence of hydrogen favors reaction (2).

Figure 1:
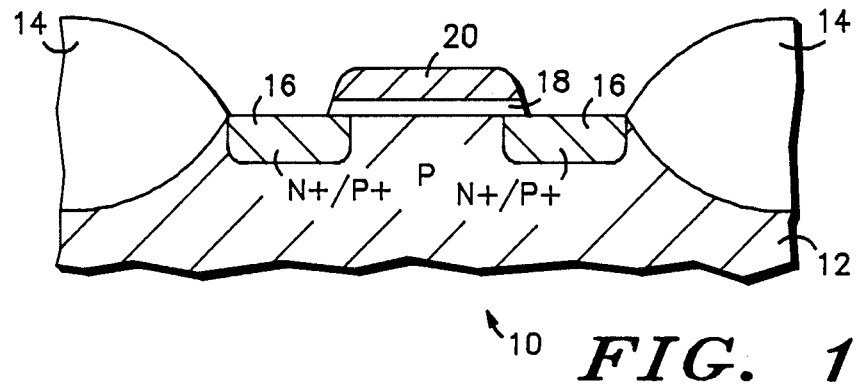
FIG. 1 is a cross sectional illustration of a MOSFET after growth of a polysilicon gate.

Shown in FIG. 1 is a cross sectional illustration of a metal oxide semiconductor field effect transistor (MOSFET) 10 under construction. Substrate 12 already has formed thereon two field silicon dioxide isolation regions 14 between which MOSFET 10 is being built. Preohmic n+ source/drain depletion regions 16, gate oxide 18 and polysilicon gate 20 have also already been formed.

Figure 2:
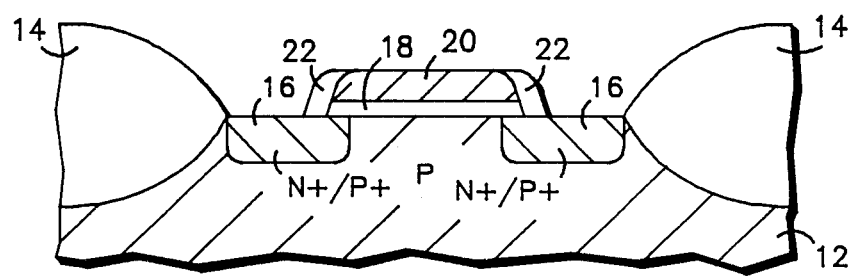
FIG. 2 is a cross sectional illustration of the MOSFET of FIG. 1 after formation of silicon dioxide sidewalls and subsequent etch.

Shown in FIG. 2 is a cross sectional illustration of the MOSFET 10 of FIG. 1 after the growth of silicon dioxide sidewalls 22 and subsequent etch of unwanted oxide from the surface of the device. It will be noted that at this stage, prior to the silicide deposition, that the only areas of exposed silicon or polysilicon are the top of gate 20 and the tops of source/drain regions 16.

Figure 3:
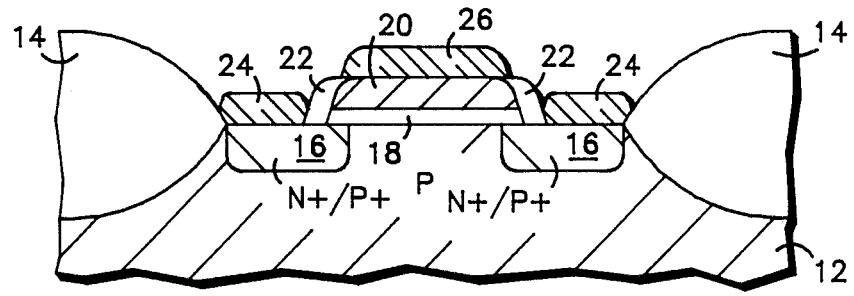
FIG. 3 is a cross sectional illustration of the MOSFET of FIG. 2 after selective formation of a titanium silicide layer in accordance with the method of the present invention.

Shown in FIG. 3 is a cross section of MOSFET 10 from FIG. 2 after the $TiSi_2$ layer has been selectively formed to form source/drain silicidation interconnects 24 and gate silicidation interconnect 26. FIG. 3 also shows that the $TiSi_2$ forms only where silicon or polysilicon was exposed. It is expected that if other materials were exposed, no titanium would be deposited on those surfaces as well. In the inventive technique, if the reaction temperature falls below about 700° C., then no reaction will occur and, of course, no loss in selectivity will result. If a thin silicon dioxide layer is present, the silicide may not deposit, and the wafer may have to be recleaned and reworked, but the wafer will not be ruined. By way of contrast, in the case of tungsten deposition, if a thin $SiO_2$ layer is present or the reaction temperature rises too high, loss of selectivity will occur and tungsten will be deposited over the entire surface of the wafer, rendering the wafer useless. Since the process is completely selective, no extra masks need be worked up for the $TiSi_2$ layer.

It should also be noted that, as opposed to prior art salicidation processes, there is no need to anneal the silicide layer or to remove unreacted titanium. By definition if titanium exists on the wafer surface it is bound up in the TiSi$_2$ areas only. In addition, no encroachment of the TiSi$_2$ occurs during processing.

The process of this invention is further illustrated by the following example which is not intended to limit the invention, but rather to illuminate it.

EXAMPLE 1

Nine wafers, each having exposed polysilicon and silicon dioxide areas, were placed upright in a LPCVD reactor modified as described above. The reactant gases titanium tetrachloride and hydrogen were present in a mole ratio of 1:50, and nitrogen was used as an inert diluent. The reaction temperature was 800° C. and the final pumpdown pressure was 1.5 torr. The reaction was run for 45 minutes. Average wafer weight gain was 2162 micrograms.

An Auger electron spectroscopy profile for this Example is presented in FIG. 4. It may be noted that shortly after the reaction started, at about 0.6 minutes, that the analysis becomes consistent with a TiSi$_2$ material. The arrow at about 3.5 minutes indicates the beginning of the interface with the polysilicon gate. The oxygen shown is a contaminant and is preferably not present. In an optimized system, very little or no oxygen would be detected.

The resistivities ranged from 13 to 25 microohms per cm, which is also consistent with TiSi$_2$. Absolutely no TiSi$_2$ was found on the oxide surfaces.

Sheet resistivity data were determined to be as follows with the flat oriented at the bottom of the wafer.

| Wafer No. | Sheet Resistivities for Selected Wafers | | | | |
|---|---|---|---|---|---|
| | Top | Left | Middle | Right | Bottom |
| 2 | .28 | .64 | .13 | .28 | .45 |
| 3 | .19 | .23 | .12 | .21 | .22 |
| 4 | .15 | .23 | .12 | .21 | .22 |
| 5 | .14 | .15 | .14 | .20 | .15 |
| 6 | .25 | .19 | .17 | .20 | .25 |

The preferred proportions of reactants for the inventive process, expressed in terms of flow rates, are from 500–2000 standard cubic cnetimeters/minute (sccm) hydrogen, 5–20 sccm titanium tetrachloride and 0–1000 sccm nitrogen. These proportions reflect the need for a dilute titanium contribution. The nitrogen is recognized as an optional ingredient, useful as an inert diluent.

I claim:

1. A process for selectively forming titanium silicide on silicon and polysilicon surfaces via low pressure chemical vapor deposition (LPCVD) comprising introducing a titanium halide gas and a stoichiometric excess of hydrogen with respect to said titanium halide gas into a reaction zone having silicon and/or polysilicon surfaces wherein the reaction temperature ranges from 700° to 1000° C. and the reaction pressure ranges from 0.5 to 1.5 torr, in the absence of a silicon-bearing gas.

2. The process of claim 1 in which the reaction temperature ranges from 750° to 850° C.

3. The process of claim 1 in which the titanium halide gas is a titanium tetrahalide gas.

4. The process of claim 3 in which the titanium tetrahalide gas is titanium tetrachloride.

5. The process of claim 1 in the absence of subsequent anneal and unreacted titanium etch steps.

6. The process of claim 1 in which the titanium halide is present in the gaseous reaction mixture in a concentration of at least 1:50.

7. The process of claim 1 in which nitrogen may be present and the ratios of flow rates of titanium halide:nitrogen:hydrogen range from 5:0:500 sccm to 20:1000:2000 sccm.

8. A process for producing a semiconductor device comprising a low resistivity layer of titanium silicide selectively overlying a region of silicon comprising the steps of
   providing a single crystal silicon substrate,
   forming regions of a polycrystalline silicon material,
   forming regions of a silicon oxide material in the neighborhood of the polycrystalline silicon material and
   forming a titanium silicide layer selectively on the single crystal and polycrystalline silicon material, the improvement comprising reacting a gaseous titanium halide with the single crystal and polycrystalline silicon material at a temperature in the range of 700° to 1000° C. and a pressure in the range of 0.5 to 1.5 torr in the presence of a stoichiometric excess of hydrogen with respect to said titanium halide gas and in the absence of a silicon-bearing gas to form the titanium silicide layer, in the absence of subsequent anneal and unreacted titanium etch steps.

9. The process of claim 8 in which nitrogen may be present and the ratio of flow rates of titanium halide:nitrogen:hydrogen ranges from 5:0:500 to 20:1000:2000.

10. The process of claim 8 in which the reaction temperature ranges from 750° to 850° C.

11. The process of claim 8 in which the titanium halide gas is a titanium tetrahalide gas.

12. The process of claim 11 in which the titanium tetrahalide gas is titanium tetrachloride.

13. The process of claim 8 in which the titanium halide is present in the gaseous reaction mixture in a concentration of at least 1:50.

* * * * *